United States Patent [19]

Everett et al.

[11] Patent Number: 4,490,632
[45] Date of Patent: Dec. 25, 1984

[54] NONINVERTING AMPLIFIER CIRCUIT FOR ONE PROPAGATION DELAY COMPLEX LOGIC GATES

[75] Inventors: Chauncey L. Everett; Theodore W. Houston, both of Richardson; Henry M. Darley, Plano, all of Tex.

[73] Assignee: Texas Instruments Incorporated, Dallas, Tex.

[21] Appl. No.: 324,180

[22] Filed: Nov. 23, 1981

[51] Int. Cl.³ ............... H03K 19/017; H03K 19/094; H03K 19/20
[52] U.S. Cl. .................................. 307/475; 307/446; 307/448; 307/450
[58] Field of Search ............... 307/443, 446, 448, 450, 307/475, 264, 270

[56] References Cited

U.S. PATENT DOCUMENTS 4,000,411 12/1976 Sano et al. .................. 307/475
4,110,633 8/1978 Blaser et al. ................ 307/475 X

FOREIGN PATENT DOCUMENTS 2230125 12/1974 France ........................ 307/475
50743 12/1980 Japan ......................... 307/475

OTHER PUBLICATIONS

Kalter, "Bipolar and FET Integration on a Common Chip"; IBM Tech. Discl. Bull.; vol. 15, No. 12, pp. 3755-3756; 5/1973.
Nuzillat et al., IEEE Proc., vol. 127, Pt. I, No. 5, pp. 287-296; 10/1980.
Askin et al., "Level Converting Circuit"; IBM Tech. Discl. Bull.; vol. 18, No. 11, p. 3723; 4/1976.
Van Tuyl et al., "GaAs MESFET Logic with 4-GHz Clock Rate"; IEEE-JSSC; vol. SC-12, No. 5, pp. 485-496; 10/77.

Primary Examiner—Larry N. Anagnos
Attorney, Agent, or Firm—Robert Groover; James T. Comfort; Melvin Sharp

[57] ABSTRACT

A noninverting amplifier circuit for one propagation delay complex logic gates. The noninverting amplifier circuit is compatible with field effect transistor logic, including depletion-mode Schottky barrier field effect transistor (MESFET) inverting logic, gates. The basic noninverting amplifier circuit, utilizes field effect transistors (FET) and diodes, and comprises input interface means for receiving an input voltage signal, amplifier means for providing noninverted amplification of the input voltage signal, and buffer means for driving, and shifting the voltage level of the amplified input voltage signal. In another embodiment, additional circuit means for enabling performance of the "AND" logic function is included in the basic noninverting amplifier circuit. In a third embodiment, additional circuit means for enabling performance of the "OR" logic function is included in the basic noninverting amplifier circuit. The input and output voltages of the various embodiments which utilize the noninverting amplifier logic circuit are compatible with those of inverting logic circuits. Some examples of higher level complex one propagation delay logic gates which utilize the circuit in combination with inverting logic circuitry are also illustrated.

15 Claims, 7 Drawing Figures (ONE PROPAGATION DELAY)

NONINVERTING AMPLIFIER CIRCUIT FOR ONE PROPAGATION DELAY COMPLEX LOGIC GATES

BACKGROUND OF THE INVENTION

The subject invention relates to a noninverting logic circuit, particularly suitable for one propagation delay complex logic gates, that is compatible with depletion-mode Schottky barrier field effect transistor (MESFET) inverting logic circuits. The large variety of one propagation delay complex logic gate types that can be made with the subject invention may be used in digital technology to increase the speed of operation of microprocessor type circuits and the like.

The history of integrated semiconductor circuit design has been characterized by a trend toward increasing speed and circuit densities. Various technologies have been invented to stimulate this trend. For example, transistor-transistor logic (TTL), was standard in digital equipment for a long time but has given way in many areas to N-channel metal oxide semiconductor (MOS) logic circuits because of their superiority in speed power product, packing density and ease of device fabrication. For these reasons, devices fabricated using these technologies are finding application primarily in memory, microprocessor, logic circuits, and the like. The Schottky barrier field effect transistor (MESFET) is another device that offers many of the advantages of the N-channel metal oxide semiconductor (MOS) technology without some of its disadvantages. Its primary application will also be in digital technology, such as memory circuits, random logic circuits, microprocessor type circuits and the like.

One of the major problems associated with MOSFET and MESFET technology, however, is the lack of noninverting logic circuits which provide only a one propagation delay switching speed. This is a very serious problem for it severely limits the number of complex logic gate types in which MESFET, and MOSFET, semiconductor devices can be used.

Speed is one of the principal features of merit in any logic circuit. The term "speed" usually implies the speed at which the output changes from one state to another, i.e., the slope of the transition of the output,; the delay in propagating a changed logic level through the circuit; and the rate at which the circuit can be cycled between the states, i.e., the repetition rate.

As a general principal, a semiconductor device, such as a transistor, a diode, and the like, will offer some delay in the speed at which the devices' output signal changes from one state to another in response to the devices input signal; i.e., the output signal will occur sometime after the input signal. Of course, every logic circuit, which comprises a number of circuit elements, including semiconductor devices, will, therefore, also have some delay. This delay is generally known in the art as "propagation delay time", "delay time", or simply as "delay". Many logic circuit design failures, or design limitations, result from such undesired "delay"; for the speed at which an integrated circuit can perform a logic function is inversely proportional to the propagation delay of each circuit element, including the semiconductor devices in the integrated circuit. In other words, the shorter the propagation delay of the integrated circuit, the faster is its operational "speed".

In the world of digital technology, there is a very strong demand for faster and faster operational "speeds". Accordingly, considerable effort has been devoted toward the development of complex logic gates having minimal "delay".

High-speed general purpose MESFET, and MOSFET, logic gate circuits capable of implementing two levels of logic —the "NAND" and "NOR"—in about one propagation delay have been reduced to practice. However, high speed general purpose MESFET (and MOSFET) logic gate circuits capable of implementing the two "noninverting" levels of logic —"AND" and "OR"—in only one propagation delay do not exist in the prior art.

It is a principal object of the invention to provide a noninverting circuit for one propagation delay complex logic gates that is compatible with all field effect transistor (FET), including depletion-mode Schottky barrier field effect transistor (MESFET), inverting logic circuits. Another object is to provide noninverted amplification of the input voltage signals to the circuit of the invention. An additional object is to provide a novel noninverting amplifier circuit for one propagation delay high-speed general purpose MESFET complex logic gates that is capable of implementing the two "noninverting" levels of logic —the "AND" and "OR". A further object is to provide a novel noninverting amplifier circuit for one propagation delay high-speed general purpose MOSFET complex logic gates that is capable of implementing the two "noninverting" levels of logic —the "AND" and "OR".

SUMMARY OF THE INVENTION

In accordance with the present invention, a noninverting amplifier circuit for one propagation delay complex logic gates is provided that is compatible with all field effect transistor (FET) logic, including depletion-mode Schottky barrier field effect transistor (MESFET) inverting logic, circuits. The basic noninverting amplifier circuit comprises input interface means for receiving an input voltage signal. Interconnected with the input interface means of the basic noninverting circuit is amplifier means, for providing noninverted amplification of the input voltage signal, including means for receiving a relatively high supply voltage and means for receiving a constant reference voltage. More specifically, the input interface means comprises a diode; and a first, a second and a third field effect transistor, each having a gate, a source, and a drain. The drain of the first input interface field effect transistor is connected to the relatively high supply voltage such as, for example, a drain supply voltage. The source of the first input interface transistor is connected to the drain of the second input interface transistor. The gate of the first input interface transistor is connected to the input voltage signal. The gate of the second input interface transistor is connected to its source and the source-gate thereof is connected to a relatively low supply voltage such as, for example, a source supply voltage. The drain of the third input interface field effect transistor is connected to the relatively high supply voltage, the gate is connected to the source thereof, the source-gate node formed thereby is connected to the anode of the diode, and the cathode of the diode is connected to the source-drain of the first and second input interface transistors of the input interface means.

The amplifier means comprises a first and a second switching field effect transistor, each having a gate, source and drain. The drain of the first switching transistor is connected to the relatively high supply voltage, the gate thereof is connected to its source, and the source-gate of the first switching transistor is connected to the drain of the second switching transistor. The gate of the second switching transistor is connected to a constant reference voltage such as an electrical ground. The source of the second switching transistor is connected to the anode of the input interface diode, and the source-gate of the third input interface transistor, in the input interface means.

Preferably, buffer means for driving, and shifting more negatively the voltage level of, the noninverted amplified input voltage signal is also provided. The buffer means comprises a first and a second buffer field effect transistor, and a buffer diode. The gate of the first buffer transistor is connected to the drain of the second switching transistor in the amplifier means, the drain of the first buffer transistor is connected to the relatively high supply voltage such as, for example, the drain supply voltage, and the source thereof is connected to the anode of the diode. The cathode of the diode is connected to the drain of the second buffer transistor. The gate of the second buffer transistor is connected to its source, and the gate-source of the second buffer transistor is connected to the relatively low supply voltage such as, for example, the source supply voltage.

In another embodiment of the subject invention, additional circuit means is included in the basic noninverting amplifier circuit to enable performance of the "AND" logic function. The additional circuit means comprises additional input means for receiving an additional input voltage signal, and additional amplifier means for providing noninverted amplification of the additional input voltage signal. More specifically, the additional input interface means includes a diode; and a first, a second, and a third field effect transistor, each having a gate, source and drain. The drain of the additional first input interface transistor is connected to the relatively high supply voltage such as, for example, a drain supply voltage, the source of the additional first input interface transistor is connected to the drain of the additional second input interface transistor, the gate of the additional input interface transistor is connectable to the additional input voltage signal, the gate of the additional second input interface transistor is connected to its source, and the source-gate of the additional second input interface transistor is connected to the relatively low supply voltage such as, for example, a source supply voltage. The drain of the additional third input interface transistor is connected to the relatively high supply voltage such as, for example, the drain supply voltage, the gate of the additional third input interface transistor is connected to its source, the anode of the additional input interface diode is connected to the source-gate of the additional third input interface transistor, and the source-drain of the additional first and second input interface transistors, respectively, in the additional input interface means, is connected to the cathode of the additional input interface diode.

The additional amplifier means comprises at least one additional switching field effect transistor. The drain, thereof, is connected to the source-gate of the first switching transistor in the amplifier means of the basic circuit, the gate thereof is connected to a constant reference voltage source such as an electrical ground, and the source thereof is connected to the anode of the additional diode, and the source-gate of the additional third input interface transistor, in the additional input interface means.

In a third embodiment of the subject invention, included in the basic noninverting amplifier circuit is additional circuit means for enabling the basic circuit to perform the "OR" logic function. More specifically, this additional curcuit means comprises an additional input interface means for receiving an additional input voltage signal. The additional input interface means may include a field effect transistor having a gate, source, and drain. The drain of the additional input interface transistor is connected to the relatively high supply voltage such as, for example, the drain supply voltage; the gate thereof is connectable to the additional input voltage signal; and the source thereof is connected to the cathode of the input interface diode in the input interface means of the basic noninverting amplifier circuit.

The input and output voltages of the noninverting amplifier circuit of the subject invention are compatible with the input and output voltages of inverting logic circuits. The subject invention is very fast in speed and provides for the making of an undeterminable variety of one propagation delay complex logic gate types which were heretofore unavailable with such one propagation delay.

BRIEF DESCRIPTION OF THE DRAWINGS

The novel features believed characteristic of the invention are set forth in the appended claims. The invention itself, however, as well as other objects and advantages thereof will be readily appreciated as the same becomes better understood by reference to the following detailed description of illustrative embodiments, when considered in conjunction with the accompanying drawings, wherein:

DETAILED DESCRIPTION OF THE PREFERRED EMBODIMENT

Figure 1:
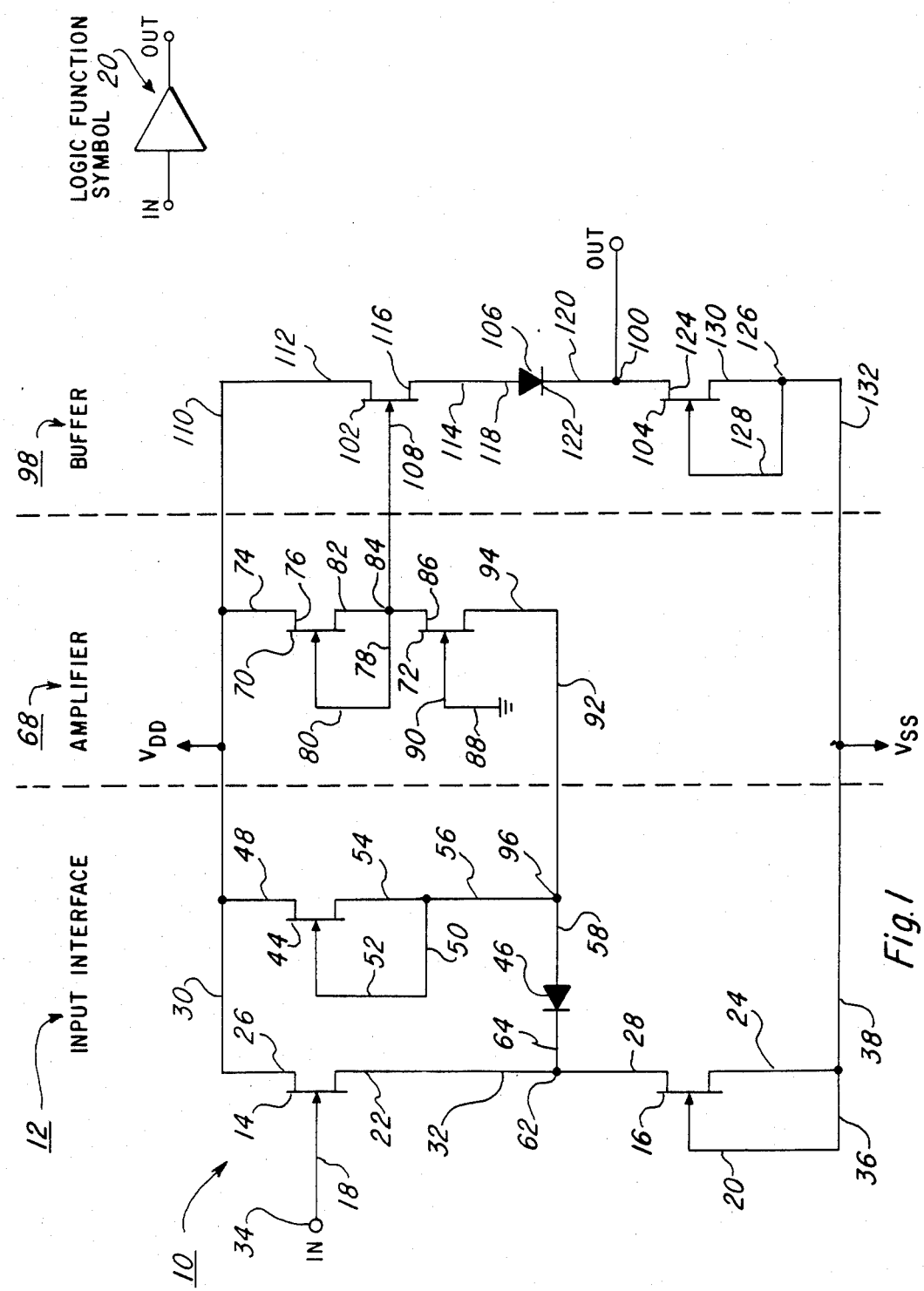
FIG. 1 is an electrical schematic diagram of the basic noninverting amplifier circuit of the subject invention that can be used to form the one propagation delay complex logic gates.

Referring to FIG. 1, a noninverting amplifier circuit constructed in accordance with the subject invention is generally shown at 10. The noninverting amplifier circuit 10 comprises an input interface means, generally shown at 12, for receiving an input voltage signal. The input interface means 12 includes a first and a second input interface field effect transistor 14 and 16, respectively, each having a gate 18 and 20, respectively, source 22 and 24, respectively, and drain 26 and 28, respectively; means, such as the electrical conductor 30 is used, for connecting a relatively high supply voltage, such as the drain supply voltage ($V_{DD}$) to the drain 26 of the first input interface transistor 14; means, such as the electrical conductor 32 is utilized, for connecting the source 22 of the first input interface transistor 14 to the drain 28 of the second input interface transistor 16; means, such as the terminal 34 is provided, for connecting the gate 18 of the first input interface transistor 14 to the input voltage signal (IN); means, such as the electrical conductor 36 is utilized, for connecting the gate 20 of the second input interface transistor 16 to the source 24 of the second input interface transistor 16; means such as the electrical conductor 36 is utilized, for connecting the gate 20 of the second input interface transistor 16 to the source 24 of the second input interface transistor 16; means, such as the electrical conductor 38 is utilized, for connecting the source 24-gate 20, of the second input interface transistor 16, to a relatively low supply voltage, such as the source supply voltage ($V_{SS}$).

The input interface means 12 also comprises a third input interface field effect transistor 44 and an input interface diode 46; means, such as, conductor 30, is used, for connecting the relatively high supply voltage, such as the drain supply voltage ($V_{DD}$), to the drain 48 of the third input interface transistor 44; means, such as the electrical conductor 50 is utilized, for connecting the gate 52 of the third input interface transistor 44 to the source 54 of the third input interface transistor 44; means, such as the electrical conductor 56 is utilized, for connecting the anode 58 of the input interface diode 46 to the source 54-gate 52 of the third input interface transistor 44; and means, such as node 62 is utilized, for connecting the source 22-drain 28 of the first and second input interface transistors 14 and 16, respectively, to the cathode 64 of the input interface diode 46.

The noninverting amplifier circuit 10 also comprises amplifier means, generally shown at 68, for providing noninverted amplification of the input voltage signal (IN). The amplifier means 68 comprises a first and a second switching field effect transistor 70 and 72, respectively; means, such as the electrical conductor 74 is utilized, for connecting the relatively high supply voltage, such as the drain supply voltage ($V_{DD}$) to the drain 76 of the first switching transistor 70; means, such as the electrical conductor 78 is utilized for connecting the gate 80 of the first switching transistor 70 to the source 82 of the first switching transistor 70; means, such as the node 84 is utilized, for connecting the drain 86 of the second switching transistor 72 to the source 82-gate 80 of the first switching transistor 70, so that the noninverted amplified input voltage signal of the noninverting amplifier circuit 10 may be detected at node 84; means, such as the electrical conductor 88 is utilized, for connecting the gate 90 of the second switching transistor 72 to a constant voltage reference source such as, for example, an electrical ground; and means, such as the electrical conductor 92 is utilized, for connecting the source 94 of said second switching transistor 72 to the node 96, formed by the anode 58 of the input interface diode 46 and the source 54-gate 52 of the third input interface transistor 44, in the input interface means 12.

Preferably, the noninverting amplifier circuit 10 further comprises buffer means, generally shown at 98, for driving the noninverted amplified input voltage signal detectable at node 84, shifting more negatively the voltage level of the signal at node 84, and providing a buffered output signal to an output node 100. The buffer means 98 includes a first and a second buffer field effect transistor 102 and 104, respectively; a buffer means diode 106; means, such as, for example, node 84, for connecting the gate 108 of the first buffer transistor 102 to the drain 86 of the second switching transistor 72 of the amplifier means 68; means, such as the electrical conductor 110 is utilized, for connecting the relatively high supply voltage, such as the drain supply voltage ($V_{DD}$), to the drain 112 of the first buffer transistor 102; means, such as the electrical conductor 114 is utilized, for connecting the source 116 of the first buffer transistor 102 to the anode 118 of the buffer diode 106; means, such as the electrical conductor 120 is utilized, for connecting the cathode 122 of the buffer diode 106 to the drain 124 of the second buffer transistor 104, thereby forming the output node 100, so that the buffered output signal of the noninverting amplifier circuit 10 may be detected at node 100; means, such as node 126 may be utilized, for connecting the gate 128 of the second buffer transistor 104 to the source 130 of the second buffer transistor 104; and means, such as the electrical conductor 132 may be utilized, for connecting the relatively low supply voltage, such as the source supply voltage ($V_{SS}$) to the gate 128-source 130 of the second buffer transistor 104.

During circuit operation, when using the same voltage supplies and semiconductor device thresholds as in existing inverting logic circuits, the input and output voltages of the noninverting amplifier circuit 10 are compatible with the input and output voltages of inverting logic circuits. Using, for example, semiconductor device thresholds of a $-0.5$ volts, a relatively high supply voltage, such as a drain supply voltage ($V_{DD}$), of a $+1.5$ volts, and a relatively low supply voltage, such as a source supply voltage ($V_{SS}$) of a $-1.5$ volts, the input and output voltage levels of the noninverting amplifier circuit 10 are approximately a $-0.8$ volts for a logic "0" and a $+0.3$ volts for a logic "1".

If the voltage level of the input signal to the noninverting amplifier circuit 10 is low, i.e., a $-0.8$ volts or logic "0", then the input interface means 12 will function like a follower so that the source 22 of the first input interface transistor 14 will be low in voltage as a result of following the low voltage level of the input voltage signal at the gate 18 of the first input interface transistor 14. There would be a diode voltage drop across the input interface diode 46 causing the anode 58 of the input interface diode 46 to be pulled down in voltage. If the cathode 64 of the input interface diode 46 is pulled sufficiently low by the second input interface transistor 16, then the gate 90 to source 94 voltage of the second switching transistor 72, in the amplifier means 68, will cause the transistor 72 to be turned on. When the second switching transistor 72 is turned on, the drain 86 of the second switching transistor 72 will be kept low. Node 84 will, of course, follow the drain 86 and also be kept low. Thus, if the input voltage signal at 34 is low, then the output signal at node 84 will be low.

As the input voltage signal at 34 is brought from low to high, i.e., from a logic "0" voltage level to a logic "1" voltage level, the anode 58 of the input interface diode 46 will be brought from the low voltage level to the high voltage level; being pulled up by the third input interface transistor 44. As some point thereafter, the gate 90 to source 94 voltage of switching transistor 72 will be turned off because the gate 90 voltage is being held constant while the source 94 voltage is being increased. When the second switching transistor 72 is turned off, the drain 86 of the second switching transistor 72 will be increased approximately to the relatively high supply voltage, i.e., the drain supply voltage ($V_{DD}$), by the first switching transistor 70 of the amplifier means 68; and the buffer means 98 will follow the voltage level at node 84 and provide a buffered output signal at node 100 of the buffer means 98.

Gain or amplification in the noninverting amplifier circuit 10 occurs in the voltage swing from the source 94, of the second switching transistor 72, to the drain 86, of the second switching transistor 72. When the voltage level at the source 94 is low, the drain 86 voltage will be close to the source 94 voltage. When the voltage level at the source 94 goes high, and the transistor 72 is turned off, a larger voltage difference occurs across the source 94 and drain 86 of transistor 72, which could be extremely high. Accordingly, across the terminals of the source 94 and the drain 86 in transistor 72, is where the noninverting amplification or gain occurs.

Of course, it should be appreciated by those skilled in the art that the logic "0" voltage level must be sufficiently below the thresholds of the field effect transistors in order to solidly turn them off by a logic "0" voltage level, and the logic "1" voltage level should be slightly below where their forward gate current would be appreciable in order to maximize the amplification factor. In other words, while the field effect transistor thresholds of −0.5 volts, the drain supply voltage ($V_{DD}$) of +1.5 volts, the source supply voltage ($V_{SS}$) of −1.5 volts, and the input and output voltage levels of −0.8 volts for logic "0" and +0.3 volts for logic "1" are typical MESFET values, these values can also be used to render any other effect transistors, such as MOSFET, operational as well. It, therefore, should be clearly understood that their use herein is intended as merely words of description rather than of limitation; i.e., many other values can be utilized effectively by the subject invention. In short, without departing from the scope of the appended claims, those persons skilled in the art will be able to specify the circuit parameters, such as the type of field effect transistors including enhancement or depletion mode, the device thresholds, the supply voltages, the device length/width ratios, the input/output voltages, and the like, which are most suitable for their specific application of the subject invention.

It should also be appreciated by those skilled in the art that there are no other MESFET or MOSFET logic circuits which provide noninverted amplification of the input signal.

It should be further appreciated that in the FET technologies, prior art logic circuits which provide amplification or voltage gain without inversion are not available.

The semiconductor devices comprising the noninverting amplifier circuit 10 may be made of any suitable semiconductor material, for example, gallium arsenide (GaAs) or silicon (Si).

It should be finally appreciated by those skilled in the art that the subject invention is uniquely suited for use in integrated circuit digital technology.

Figure 2:
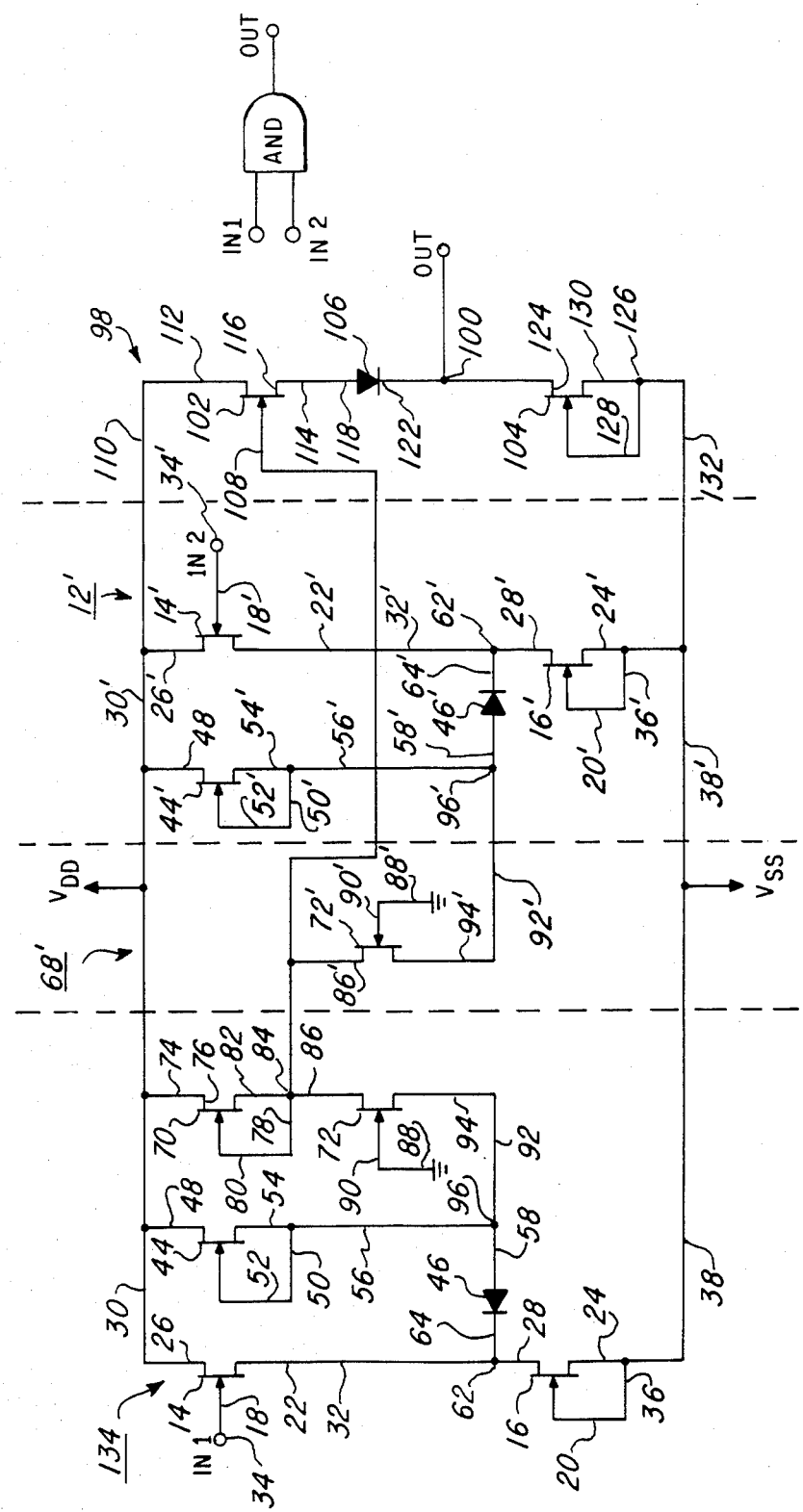
FIG. 2 is an electrical schematic diagram of a multiple input AND logic gate circuit made in accordance with the subject invention that can be used in the formation of the one propagation delay complex logic gates.

Another embodiment of the present invention is best illustrated in FIG. 2. In FIG. 2, a noninverting amplifier "AND" logic circuit constructed in accordance with the subject invention is generally shown at 134. The noninverting amplifier "AND" logic circuit 134 comprises the noninverting amplifier circuit 10, as best illustrated in FIG. 1, wherein interposed in the circuit 10 is additional circuit means, such as the additional input interface means 12' for receiving an additional input voltage signal (IN2), and the additional amplifier means 68' for providing noninverted amplification of the additional input voltage signal (IN2), as best illustrated in the "AND" logic circuit 134 of FIG. 2.

The additional input interface means 12' includes a first and a second input interface field effect transistor 14' and 16' respectively, each having a gate 18' and 20', respectively, source 22' and 24', respectively, and drain 26' and 28', respectively; means, such as the electrical conductor 30' is used for connecting the relatively high supply voltage, such as the drain supply voltage ($V_{DD}$) to the drain 26' of the additional first input interface transistor 14'; means such as the electrical conductor 32' is utilized, for connecting the source 22' of the additional first input interface transistor 14' to the drain 28' of the additional second input interface transistor 16'; means 34', is provided, for connecting the gate 18' of the additional first input interface transistor 14' to the additional input voltage signal (IN2); means, such as the electrical conductor 36' is utilized, for connecting the gate 20' of the additional second input interface transistor 16' to the source 24' of the additional second input interface transistor 16'; and means, such as the electrical conductor 38' is utilized, for connecting the source 24'—gate 20', of the additional second interface transistor 16', to the relatively low supply voltage such, as the source supply voltage ($V_{SS}$).

The additional input interface means 12' also comprises an additional third input interface field effect transistor 44' and an additional input interface diode 46'; means 30', is used, for connecting the relatively high supply voltage such as the drain supply voltage ($V_{DD}$) to the drain 48' of the additional third input interface transistor 44'; means, such as the electrical conductor 56' is utilized, for connecting the anode 58' of the additional input interface diode 46' to the source 54'—gate 52' of the additional third input interface transistor 44'; and means, such as node 62' is utilized, for connecting the source 22'—drain 28' of the additional first and second input interface transistors 14' and 16', respectively, to the cathode 64' of the additional input interface diode 46'.

The noninverting amplifier "AND" logic circuit 134 further comprises additional amplifier means, generally shown at 68', for providing noninverted amplification of the additional input voltage signal (IN2). The additional amplifier means 68' comprises an additional field effect transistor 72'; means, such as the node 84 in the noninverting amplifier circuit 10, as best illustrated in both FIGS. 1 and 2, is utilized, for connecting the drain 86' of the additional switching transistor 72' to the source 82—gate 80 of the first switching transistor 70 in the noninverting amplifier circuit 10; means, such as the electrical conductor 88' is utilized, for connecting the gate 90' of the additional switching transistor 72' to a constant voltage reference source such as, for example, an electrical ground; and means, such as the electrical conductor 92' is utilized for connecting the source 94' of the additional switching transistor 72' to the node 96', formed by the anode 58' of the additional input interface diode 46' and the source 54'—gate 52' of the additional third input interface transistor 44', in the additional input interface means 12'.

The corresponding portions of the noninverting amplifier "AND" logic circuit 134 have the same function as in the noninverting amplifier circuit 10 (described hereinabove).

Figure 3:
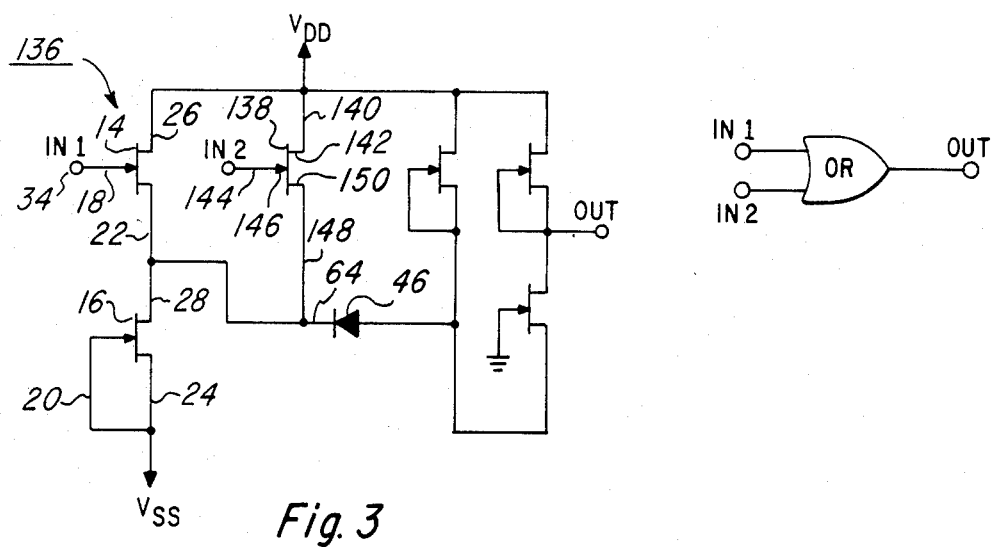
FIG. 3 is an electrical schematic diagram of a multiple input OR logic gate circuit made in accordance with the subject invention that can be used in the formation of the one propagation delay complex logic gates.
Figure 4:
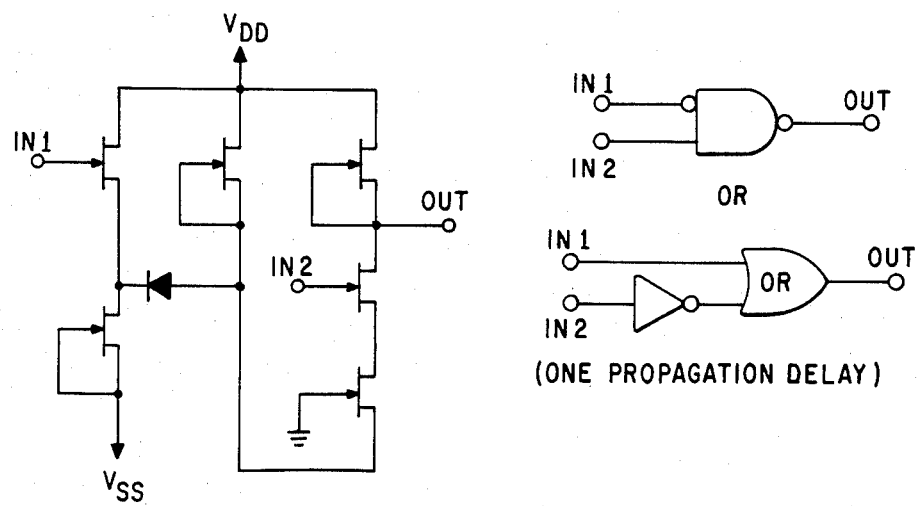
FIGS. 4–7 are electrical schematic diagrams generally illustrative of the large variety of multiple input one propagation delay complex logic gates that can be made in accordance with the subject invention.
Figure 5:
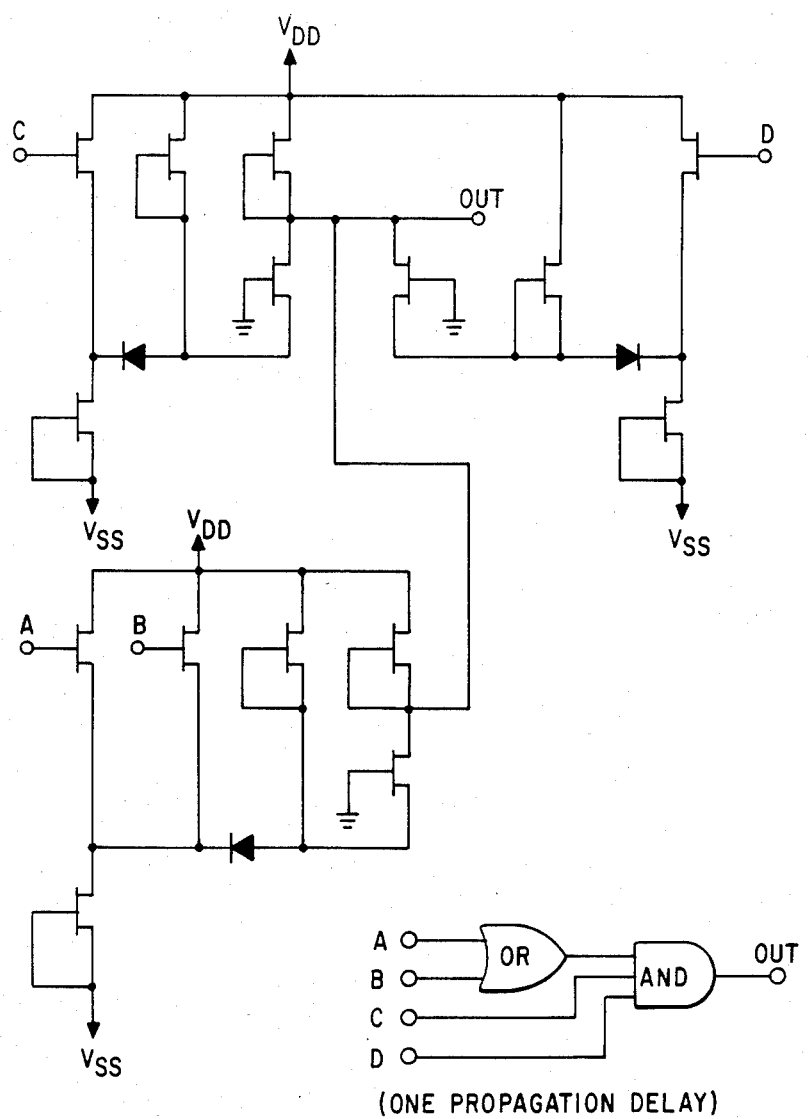
Figure 6:
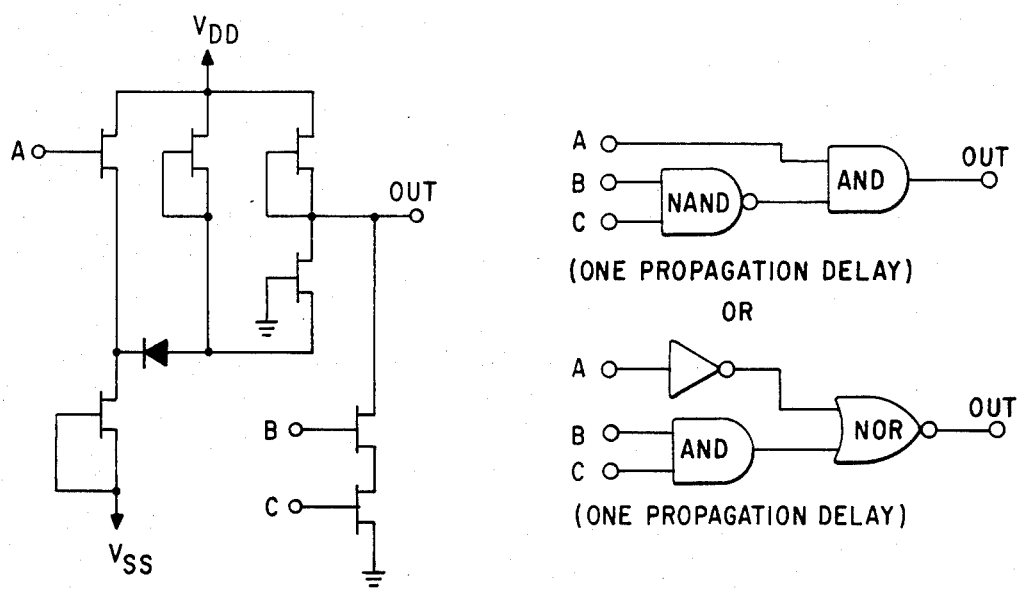
Figure 7:
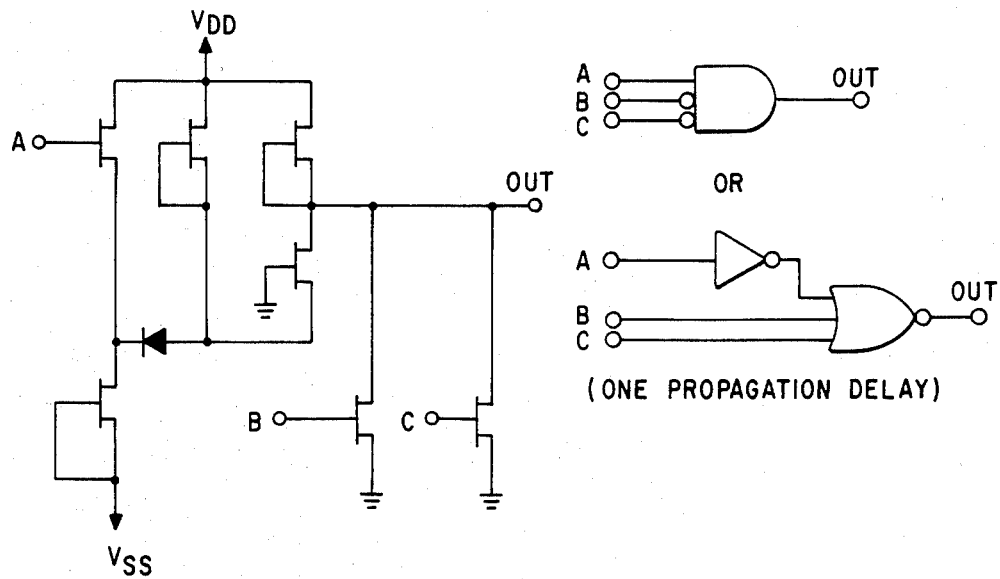

A third embodiment of the present invention is best illustrated in FIG. 3. In FIG. 3, a noninverting amplifier "OR" logic circuit constructed in accordance with the subject invention is generally shown at 136. The noninverting amplifier "OR" logic circuit 136 comprises a noninverting amplifier circuit 10, as best illustrated in FIG. 1, having no buffer means 98; and additional input interface means, such as the field effect transistor 138, for receiving the additional input voltage signal (IN2), as best illustrated in FIG. 3. The additional input interface means 138 includes means, such as the electrical conductor 140, for connecting the relatively high supply voltage, such as the drain supply voltage ($V_{DD}$) to the drain 142 of the additional input interface transistor 138; means, such as the electrical conductor 144, for providing the additional input voltage signal (IN2) to the gate 146 of the additional input interface transistor 138; and means, such as the electrical conductor 148, for connecting the source 150 to the cathode 64 of the input interface diode 46 in the input interface means 12 of the noninverting amplifier circuit 10.

The corresponding portions of the noninverting amplifier "OR" logic circuit 136 have the same function as in the noninverting amplifier circuit 10 (described hereinabove).

It should now be obvious to those persons skilled in the art that a large variety of one propagation delay complex logic gates can be constructed utilizing the subject invention. FIGS. 4 through 7 are inexhaustive circuit illustrations of the large variety of one propagation delay complex logic gates that can be made in accordance with the subject invention.

The invention has been described in an illustrative manner, and it is to be understood that the terminology which has been used is intended to be in the nature of words of description rather than of limitation.

Obviously, as FIGS. 4 through 7 illustrate, many modifications and variations of the present invention are possible in light of the above teachings. It is, therefore, to be clearly understood that within the scope of the appended claims, the subject invention may be practiced otherwise than as specifically described.

The embodiments of the invention in which an exclusive property or privilege is claimed are defined as follows:

1. A noninverting amplifier circuit for one propagation delay logic gates compatible with depletion mode Schottky barrier field effect transistor inverting amplifier circuits comprising an input interface means for receiving an input voltage signal, said input interface means including:

(a) a first, second and third input interface field effect transistor, each having a gate, source and drain;
(b) a diode;
(c) means for connecting a relatively high supply voltage to the drain of said first input interface transistor;
(d) means for connecting the source of said first input interface transistor to the drain of said second input interface transistor;
(e) means for connecting the gate of said first input interface transistor to the input voltage signal;
(f) means for connecting the gate of said second input interface transistor to the source of said second input interface transistor;
(g) means for connecting the source gate of said second interface transistor to a relatively low supply voltage;
(h) means for connecting the relatively high supply voltage to the drain of said third input interface transistor;
(i) means for connecting the gate of said third input interface transistor to the source of said third input interface transistor and to the amplifier means;
(j) means for connecting the anode of said input interface diode to an amplifier means and to the source-gate of said third input interface transistor;
(k) means for connecting the cathode of said input interface diode to the source of said first input interface transistor and the drain of said second input interface transistor of said input interface means; and
(l) amplifier means for providing noninverted amplification of the input voltage signal in one propagation delay; said amplifier means connected to said input interface means including means for receiving the relatively high supply voltage.

2. A noninverting amplifier circuit for one propagation delay logic gates compatible with depletion mode Schottky barrier field effect transistor inverting amplifier circuits comprising:

(a) input interface means for receiving an input voltage signal and outputting a corresponding signal; said input interface means including means for receiving a relatively high supply voltage and means for receiving relatively low supply voltage; and amplifier means including:
(b) a first and a second switching field effect transistor, each having a gate, source and drain;
(c) means for connecting the relatively high supply voltage to the drain of said first switching transistor;
(d) means for connecting the gate of said first switching transistor to the source of said first switching transistor;
(e) means for connecting the drain of said second switching transistor to the source-gate of said first switching transistor, so that the noninverted amplified input voltage signal of said noninverting amplifier circuit maybe detected thereat;
(f) means for connecting the gate of said second switching transistor to a constant voltage reference source; and
(g) means for connecting the source of said second switching transistor to the output of said input interface means so that the source of said second switching transistor is responsive to the voltage level of the input voltage signal.

3. A noninverting amplifier circuit as set forth in claim 2, further comprising buffer means for driving, and shifting the voltage level of, the noninverted amplified input voltage signal of said noninverting amplifier circuit.

4. A noninverting amplifier circuit for one propagation delay logic gates, compatible with depletion-mode Schottky barrier field effect transistor (MESFET) inverting amplifier circuits, which comprises:

(a) input interface means for receiving an input voltage signal; said input interface means including a first, a second and a third input interface field effect transistor, each having a gate, source, and drain; an input interface diode; means for connecting a drain supply voltage to the drain of said first input interface transistor, means for connecting the source of said first input interface transistor to the drain of said second input interface transistor, means for connecting the gate of said first input interface transistor to the input voltage signal, means for connecting the gate of said second input interface transistor to the source of said second input interface transistor, means for connecting the source-gate of said second input interface transistor to a source supply voltage, means for connecting the drain supply voltage to the drain of said third input interface transistor, means for connecting the gate of said third input interface transistor to the source of said third input interface transistor, means for connecting the anode of said input interface diode to the source-gate of said third input interface transistor, and means for connecting the source-drain common connection of said first and second input interface transistors to the cathode of said input interface diode; and (b) amplifier means for providing noninverted amplification of the input voltage signal; said amplifier means having a first and a second switching field effect transistor, means for connecting the drain supply voltage to the drain of said first switching transistor, means for connecting the gate of said first switching transistor to the source thereof, means for connecting the drain of said second switching transistor to the source-gate of said first switching transistor, so that the noninverted amplified input signal of said noninverting amplifier circuit may be detected thereat, means for connecting the gate of said second switching transistor to a constant voltage reference source, and means for connecting the source of said second switching transistor to the anode of said input interface diode, and the source-gate of said third input interface transistor, in said input interface means.

5. A noninverting amplifier circuit as set forth in claim 4, further comprising buffer means for driving the detectable noninverted amplified input signal, shifting more negatively the voltage level therof, and providing the buffered noninverted amplified signal to an output; said buffer means having a first and a second buffer field effect transistor; a buffer diode; means for connecting the gate of said buffer transistor to the drain of said second switching transistor in said amplifier means; means for connecting the drain supply voltage to the drain of said first buffer transistor; means for connecting the source of said first buffer transistor to the anode of said buffer diode; means for connecting the cathode of said buffer diode to the drain of said second buffer transistor, thereby forming the output, so that the buffered signal of said noninverting amplifier circuit may be detected thereat; means for connecting the gate of said second buffer transistor to the source of said second buffer transistor; and means for connecting the source supply voltage to the gate-source of said second buffer transistor.

6. A noninverting amplifer circuit as set forth in claim 4 or claim 5 wherein interposed in said noninverting amplifier circuit is additional noninverting means, for enabling said circuit to perform the "AND" logic function, said additional noninverting means comprising:

(a) additional input interface means for receiving an additional input voltage signal; said additional input interface means including a first, a second and a third additional input interface field effect transistor, each having a gate, source, and drain; an additional input interface diode; means for connecting the drain supply voltage to the drain of said additional first input interface transistor, means for connecting the source of said additional first input interface transistor to the drain of said additional second input interface transistor, means for connecting the gate of said additional first input interface transistor to the additional input voltage signal, means for connecting the gate of said additional second input interface transistor to the source of said additional second input interface transistor, and means for connecting the source-gate of said additional second input interface transistor to the source supply voltage, means for connecting the drain supply voltage to the drain of said additional third input interface transistor, means for connecting the gate of said additional third input interface transistor to the source of said additional third input interface transistor, means for connecting the anode of said additional input interface diode to the source-gate of said additional third input interface transistor, and means for connecting the source-drain common connection of said additional first and additional second input interface transistors in said additional input interface means to the cathode of said additional input interface diode; and (b) additional amplifier means for providing noninverted amplification of the additional input voltage signal; said additional amplifier means having an additional switching field effect transistor, means for connecting the drain of said additional switching transistor to the source-gate of said first switching transistor in said amplifier means, means for connecting the gate of said additional switching transistor to the constant voltage reference source, and means for connecting the source of said additional switching transistor to the anode of said additional input interface diode, and the source-gate of said additional third input interface transistor, in said additional input interface means.

7. A noninverting amplifier circuit as set forth in claim 4, wherein interposed in said noninverting amplifier circuit is additional means, for enabling said circuit to perform the "OR" logic function, said additional means comprising: an additional input interface means for receiving an additional input voltage signal; said additional input interface means including an additional field effect transistor having a gate, source, and drain; means for connecting the drain supply voltage to the drain of said additional input interface transistor; means for providing the additional input voltage signal to the gate of said additional input interface transistor; and means for connecting the source of said additional input interface transistor to the cathode of said input interface diode in said input interface means of said noninverting amplifier circuit.

8. A noninverting amplifier "AND" logic circuit, which comprises; (a) first FET input interface means for receiving a first voltage signal and providing a corresponding output signal; (b) second FET input interface means for receiving a second voltage signal and providing a corresponding output signal; (c) logic means connected to said output signals of said first and second input interface means for providing an "AND" output from said first and second signals; (d) FET amplifier means for providing noninverted amplification of the output voltage signal; and (e) means for electrically connecting said input interface means to said amplifier means.

9. A noninverting amplifier "OR" logic circuit which, comprises; (a) first FET input interface means for receiving a first voltage signal and providing a corresponding output signal; (b) second FET input interface means for receiving a second voltage signal and providing a corresponding output signal; (c) logic means connected to said output signals of said first and second input interface means for providing an "OR" output from said first and second voltage signals; (d) FET amplifier means for providing noninverted amplification of the output voltage signal; and (e) means for electrically connecting said input interface means to said amplifier means.

10. A circuit as set forth in claim 1, claim 2, claim 4, claim 8 or claim 9, wherein said field effect (FET) transistors comprise Schottky barrier field effect (MESFET) transistors.

11. A circuit as set forth in claim 10, wherein said MESFET transistors comprise depletion mode MESFET transistors.

12. A circuit as set forth in claim 10, wherein said MESFET transistors comprise enhancement mode MESFET transistors.

13. A circuit as set forth in claim 1, 2, 4, 8 or 9, wherein said field effect (FET) transistors comprise metal oxide semiconductor field effect (MOSFET) transistors.

14. A circuit as set forth in claim 13, wherein said MOSFET transistors comprise depletion mode MOSFET transistors.

15. A circuit as set forth in claim 13, wherein said MOSFET transistors comprise enhancement mode MOSFET transistors.

* * * * *